United States Patent [19]
Howell et al.

[11] Patent Number: 5,472,519
[45] Date of Patent: Dec. 5, 1995

[54] CONDUCTING POLYMER THERMOELECTRIC MATERIAL AND PROCESS OF MAKING SAME

[75] Inventors: Barbara F. Howell, Arnold; Thomas D. Gracik, Glen Burnie; Charles M. Hogg, Arnold, all of Md.

[73] Assignee: The United States of America as represented by the Secretary of the Navy, Washington, D.C.

[21] Appl. No.: 454,484

[22] Filed: May 30, 1995

Related U.S. Application Data

[63] Continuation of Ser. No. 266,079, Jun. 27, 1994, abandoned.

[51] Int. Cl.$^6$ ........................................... H01L 35/24
[52] U.S. Cl. ........................................... 136/236.1; 136/201
[58] Field of Search ........................... 136/200, 236.1, 136/238, 239, 201

[56] References Cited

U.S. PATENT DOCUMENTS

| | | | |
|---|---|---|---|
| 5,158,707 | 10/1992 | Vestburg et al. | 252/500 |
| 5,202,261 | 4/1993 | Musho et al. | 435/288 |
| 5,250,439 | 10/1993 | Musho et al. | 435/25 |
| 5,286,418 | 2/1994 | Hannecart et al. | 252/500 |

OTHER PUBLICATIONS

H. Isotalo "ACTA Polytechnica Scandinavica" Applied Physics Series No. 179, 1992, pp. 1–8.

Vining, C. B. Ed., Proceedings of the International Conference on Thermoelectrics (USA) Mar. 19–21, 1990 JPL Report—7749 pp. 1–26.

*Primary Examiner*—Donald P. Walsh
*Assistant Examiner*—Chrisman D. Carroll
*Attorney, Agent, or Firm*—Charles D. Miller

[57] ABSTRACT

A thermoelectric material is provided whose temperature decreases upon passing an electric current therethrough. The material is a mixture of poly-3-octylthiophene and ferric chloride in a respective molar ratio of approximately 2:1.

8 Claims, No Drawings

CONDUCTING POLYMER THERMOELECTRIC MATERIAL AND PROCESS OF MAKING SAME

The invention described herein may be manufactured and used by or for the Government of the United States of America for governmental purposes without payment of any royalties thereon or therefor. This application s a continuation of application Ser. No. 08/266,079, filed Jun. 27, 1994, now abandoned.

FIELD OF THE INVENTION

The invention relates generally to polymers, and more particularly to a conducting polymer composition for use as a thermoelectric material.

BACKGROUND OF THE INVENTION

Thermoelectric materials lower the temperature when an electric current is passed therethrough and have traditionally been made from a variety of semiconducting materials whose usefulness is quantified in terms of the material's "figure of merit" is defined by the relation $$F = \frac{S^2 \sigma}{\kappa}$$

where

S=the material's Seebeck coefficient in micro volts/Kelvin ($\mu V/K$);

$\sigma$=the material's electrical conductivity in Siemen/centimeter (S/cm); and $\kappa$=the material's heat conductivity in milliwatts/Kelvin-centimeter (mW/K-cm).

Thus, in terms of a material's thermoelectric properties, the material with the larger figure of merit is most desirable. However, to be useful as thermoelectric material, many applications require that the material also:

have a high melting point to withstand exposure to temperatures expected during actual use;

be chemically stable so as not to break down over time;

have low vapor pressure such that components of the material are not lost over time or during heating;

have a good degree of mechanical strength, i.e., must not be brittle; and be of low density to minimize weight.

A variety of conducting polymers have been suggested as thermoelectric materials owing to their low density and low heat conductivity. With respect to heat conductivity, the heat transfer mechanism is via coupled lattice vibrations which do not transfer heat as efficiently as electron transfer in, for example, metals. Thus, heat conductivity of a conducting polymer is less than that of metals thereby having a positive effect on the material's figure of merit. However, to date, proposed conducting polymer thermoelectric materials have had either low Seebeck coefficients (e.g., in the range of 10–20 $\mu V/K$), low electrical conductivity (e.g., in the range of 10 S/cm), or been lacking in one or more of the aforementioned desired material properties. For example, polythiophene-polyethylenevinylacetate doped with ferric chloride has a Seebeck coefficient of 24 $\mu V/K$ and an electrical conductivity 10–100 S/cm. Another proposed thermoelectric material, e.g., ferric chloride doped polyparaphenylene, has been reported to have a Seebeck coefficient of 1200 $\mu V/K$ at room temperature. However, this material's electrical conductivity is only $2 \times 10^{-8}$ S/cm.

SUMMARY OF THE INVENTION

Accordingly, an object of the present invention is to provide a conducting polymer thermoelectric material and process for making same that achieves a high figure of merit.

Another object of the present invention is to provide a high Seebeck coefficient conducting polymer thermoelectric material and process for making same.

Yet another object of the present invention is to provide a conducting polymer thermoelectric material and process for making same such that the material has good electrical conductivity.

Still another object of the present invention is to provide a conducting polymer thermoelectric material and process for making same such that the material has low heat conductivity.

Another object of the present invention is to provide a thermoelectric material and process for making same such that the material is low density, chemically stable and has a high melting temperature.

Other objects and advantages of the present invention will become more obvious hereinafter in the specification and drawings.

In accordance with the present invention, a thermoelectric material is provided whose temperature decreases upon passing an electric current therethrough. The material is a mixture of poly-3-octylthiophene and ferric chloride in a respective molar ratio of approximately 2:1. The process for making the material first combines a first solvent of toluene with poly-3-octylthiophene and ferric chloride. The poly-3-octylthiophene and ferric chloride are supplied in a respective molar ratio of approximately 2:1. The first solvent, poly-3-octylthiophene and ferric chloride are mixed for a first period of time during which the poly-3-octylthiophene and ferric chloride are partially dissolved. A second solvent of toluene and ethanol is then mixed with the first solvent, the poly-3-octylthiophene and the ferric chloride for a second period of time during which the poly-3-octylthiophene mixture with the ferric chloride is completely dissolved. The first and second solvents are then removed, e.g., by reduced pressure evaporation. The resulting poly-3-octylthiophene that is completely mixed with the ferric chloride forms the thermoelectric material.

DETAILED DESCRIPTION OF THE INVENTION

The present invention is an electrically conductive polymeric compound whose temperature decreases as an electric current is applied thereto. Specifically, the compound is poly-3-octylthiophene doped with ferric chloride. The molar ratio of poly-3-octylthiophene to ferric chloride is approximately 2:1. The procedure for making this polymeric compound will now be described by way of example.

EXAMPLE

The poly-3-octylthiophene and ferric chloride are provided in powder form to facilitate mixing. The poly-3-octylthiophene and ferric chloride are mixed in a molar ratio of approximately 2:1 with an appropriate amount of solvent. In the example, this was done by mixing 0.01 mole of poly-3-octylthiophene (based on the molecular weight of the poly-3-octylthiophene monomer), 0.005 mole of ferric chloride and 250 milliliters of toluene. The mixture was stirred for approximately 15 hours at room temperature after which time some sediment remained. To complete the dissolution, a second solvent of 200 milliliters of toluene and 75 milliliters of ethanol was added to the existing mixture. The new mixture was stirred for approximately 1 hour after which time the poly-3-octylthiophene and ferric chloride were completely dissolved in the solvent. The solvents were removed by evaporation, e.g., rotary vacuum evaporator, at the slightly elevated temperature of 45° C. The resulting polymeric material was in a powdery non-crystalline form which was pressed into pellet form under pressure for purposes of measuring heat/electrical conductivity and Seebeck coefficient.

The advantages of the present invention are numerous. Performance testing revealed that the polymeric compound of poly-3-octylthiophene and ferric chloride in the molar ratio of approximately 2:1 has a Seebeck coefficient of 1800 $\mu V/°K.$, an electrical conductivity of 0.0074 S/cm, and a heat conductivity estimated to be $10^{-3}$ mW/K-cm. Thus, the polymeric compound of the present invention achieves a higher figure of merit than current state-of-the-art thermoelectric materials. The polymeric compound is non-volatile, has a melting point of approximately 200° C., is of low density (i.e., less than 2 grams/cm$^3$), and is not brittle.

Although the invention has been described relative to a specific embodiment thereof, there are numerous variations and modifications that will be readily apparent to those skilled in the art in the light of the above teachings. It is therefore to be understood that, within the scope of the appended claims, the invention may be practiced other than as specifically described.

What is claimed is:

1. A thermoelectric material whose temperature decreases upon passing an electric current therethrough comprising a mixture of poly-3-octylthiophene and ferric chloride in a respective molar ratio of approximately 2:1.

2. A process for making a thermoelectric material whose temperature decreases upon passing an electric current therethrough, comprising the steps of:

combining a first solvent with poly-3-octylthiophene and ferric chloride, said poly-3-octylthiophene and said ferric chloride in a respective molar ratio of approximately 2:1;

mixing said first solvent, said poly-3-octylthiophene and said ferric chloride for a first period of time during which said poly-3-octylthiophene and said ferric chloride are partially dissolved;

combining a second solvent with said first solvent, said poly-3-octylthiophene and said ferric chloride for a second period of time during which said poly-3-octylthiophene with said ferric chloride completely dissolves; and removing said first and said second solvent wherein said poly-3-octylthiophene completely mixed with said ferric chloride forms said thermoelectric material.

3. A process as in claim 2 wherein said poly-3-octylthiophene and said ferric chloride are in powdered form prior to being combined with said first solvent.

4. A process as in claim 2 wherein said first solvent is toluene.

5. A process as in claim 4 wherein said first period of time is approximately 15 hours.

6. A process as in claim 2 wherein said second solvent is a mixture of toluene and ethanol.

7. A process as in claim 6 wherein said mixture of toluene and ethanol is in a volumetric ratio of approximately 2.67 parts toluene to 1 part ethanol.

8. A process as in claim 7 wherein said second period of time is approximately 1 hour.

* * * * *